(12) United States Patent
Koyama

(10) Patent No.: US 7,781,959 B2
(45) Date of Patent: Aug. 24, 2010

(54) ORGANIC ELECTROLUMINESCENT DEVICE AND PRODUCTION METHOD THEREOF

(75) Inventor: Tamami Koyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 475 days.

(21) Appl. No.: 11/632,058

(22) PCT Filed: Aug. 23, 2005

(86) PCT No.: PCT/JP2005/015598

§ 371 (c)(1),
(2), (4) Date: Jan. 10, 2007

(87) PCT Pub. No.: WO2006/022401

PCT Pub. Date: Mar. 2, 2006

(65) Prior Publication Data

US 2007/0194704 A1 Aug. 23, 2007

Related U.S. Application Data

(60) Provisional application No. 60/607,257, filed on Sep. 7, 2004, provisional application No. 60/666,594, filed on Mar. 31, 2005.

(30) Foreign Application Priority Data

Aug. 27, 2004 (JP) ............................. 2004-247954
Mar. 22, 2005 (JP) ............................. 2005-081635

(51) Int. Cl.
*H01J 1/62* (2006.01)
(52) U.S. Cl. ...................................... 313/503; 428/690
(58) Field of Classification Search ......... 313/500–512; 428/690; 445/24–25
See application file for complete search history.

(56) References Cited

U.S. PATENT DOCUMENTS

| 4,356,429 A | 10/1982 | Tang |
| 4,885,211 A | 12/1989 | Tang |
| 5,059,862 A | 10/1991 | VanSlyke et al. |

(Continued)

FOREIGN PATENT DOCUMENTS

EP 0 468 437 A2 1/1992

(Continued)

*Primary Examiner*—Nimeshkumar D Patel
*Assistant Examiner*—Mary Ellen Bowman
(74) *Attorney, Agent, or Firm*—Sughrue Mion, PLLC

(57) ABSTRACT

A smooth intermediate film layer having a thickness of 0.2 to 30 nm, little protrusions and a surface layer having high adhesiveness with the light-emitting layer is provided with accuracy on an anode constituting an organic electroluminescent device comprising a light-emitting compound layer present between an anode and a cathode. After the intermediate film layer is formed on the anode surface using a dry processing method by radio frequency plasma treatment or a wet processing method by a spin coating method and the like, preferably it is subjected to optimization treatment (washing) to adjust the smoothness, adhesiveness and thickness of the film. When the wet processing method is used, a surface treatment of the anode is preferably to be performed furthermore before forming the film to control the smoothness and surface conditions. Performing the treatment before and after forming the intermediate layer enables to control the thickness, smoothness and adhesiveness of the film and to obtain an organic electroluminescent device having high emission efficiency and long device life.

13 Claims, 3 Drawing Sheets

U.S. PATENT DOCUMENTS

| | | | |
|---|---|---|---|
| 5,677,572 A | 10/1997 | Hung et al. | |
| 6,127,004 A | 10/2000 | Hatwar et al. | |
| 2002/0025391 A1* | 2/2002 | Angelopoulos et al. | 428/1.4 |
| 2002/0197511 A1* | 12/2002 | D'Andrade et al. | 428/690 |

FOREIGN PATENT DOCUMENTS

| | | |
|---|---|---|
| EP | 0 468 440 A2 | 1/1992 |
| EP | 0 914 025 A1 | 5/1999 |
| EP | 1 003 178 A1 | 5/2000 |
| EP | 1 026 757 A2 | 8/2000 |
| JP | 8-157575 | 6/1996 |
| JP | 10-1665 | 1/1998 |
| JP | 2000-311869 | 11/2000 |
| WO | WO 01/18888 A1 | 3/2001 |

\* cited by examiner (1)

(2)

(3)

(4)

: phosphorescent moiety

: carrier transporting moiety

ORGANIC ELECTROLUMINESCENT DEVICE AND PRODUCTION METHOD THEREOF

CROSS REFERENCE TO THE RELATED APPLICATIONS

This is an application filed pursuant to 35 U.S.C. Section 111(a) with claiming the benefit of U.S. Provisional application Ser. No. 60/607,257 filed Sep. 7, 2004 and No. 60/666,594 filed on Mar. 3, 2005 under the provision of 35 U.S.C. Section 111(b), pursuant to 35 U.S.C. Section 119(e)(1).

TECHNICAL FIELD

The present invention relates to an organic electroluminescent device (OLED) used for a display unit, lighting equipment, backlighting for a display unit, exterior and interior décor and flat display source. More specifically, the present invention relates to an organic electroluminescent device having excellent properties in terms of luminous efficiency and durability and comprising a light emitting compound layer(s) between an anode and a cathode, wherein a smooth intermediate layer having a thickness of 0.2 to 30 nm is provided on the anode.

BACKGROUND ART

The organic light-emitting device was first reported on its high-luminance emission by C. W. Tang et al of Kodak in 1987 (see, *Appl. Phys. Lett.*, Vol. 51, page 913 (1987)). Since then, an abrupt progress has been proceeding in the development of materials and improvement of device structures and in recent years, the organic light-emitting device is actually used in a display for car audios or cellular phones. In order to more expand the use of this organic electroluminescent (EL) device, development of materials for improving the performance of the device in terms of emitting efficiency, luminescent color or durability, or development of full color displays are being aggressively made at present. In order to further improve the performance of the organic light-emitting devices, it is necessary to establish a device structure suitable for the material properties and a method for producing devices as well as to develop light-emitting materials. Approaches to improving properties of devices differ depending on whether the light-emitting material is a low-molecular or polymer substance. The background art is described starting from a low-molecular substance.

The light-emitting material used for the organic electroluminescent device proposed by C. W. Tang et al was a low-molecular compound. It has not changed then and now that a vacuum deposition method has been widely used to form organic electroluminescent devices using a low-molecular compound as the light-emitting material. In the organic electroluminescent device proposed by C. W. Tang et al, two kinds of low-molecular compounds are sequentially deposited on an anode substrate by vapor deposition, and a cathode is further deposited thereon to form a device having a two-layer structure. One organic layer is selected to inject and transport holes (a hole transporting compound) and the other organic layer is selected to inject and transport electrons (an electron transporting compound). The interface between the two layers provides a site for recombination of electrons with holes and a resulting light emission. (See U.S. Pat. No. 4,356,429 and other numbers of patent publications for specific examples.)

The above-mentioned organic electroluminescent device having a two-layer structure in the early development has greatly developed, and numerous examples have been given in which the improvement of the device performance is attained by adopting a multilayer structure having three or more layers.

Thus, in order to convert the electric energy into light energy with minimum loss, it has been attempted to improve the device performance by combining organic compounds having different carrier transporting properties and further by layer-by-layer depositing the compounds in a best suited order. The improvement of the material necessary for attaining high performance has been made not only on a hole transporting or electron transporting material but also on a light emitting material. As a result, by using a phosphorescent material in place of a fluorescent material, external quantum efficiency exceeding 5% which is said to be the maximum with a fluorescent material has been attained (Proceedings of the 11$^{th}$ International Workshop on Inorganic and Organic Electroluminescence (EL2002), pages 283-286, 2002).

The factor attributing to improvement of the device performance is not only the light-emitting material constituting the device but the constitution of an anode and a cathode to apply voltage to the light-emitting material greatly influences the performance as well.

It is well known now that the operating voltage of an organic electroluminescent (EL) device may notably lower by using a low work function cathode and a high work function anode. A preferable cathode is, as described in U.S. Pat. No. 4,885,211 by Tang et al and U.S. Pat. No. 5,059,862 by Van Slyke et al, constructed by combining a metal having a work function lower than 4.0 eV and a metal having a work function higher than 4.0 eV. U.S. Pat. No. 5,677,572 by Hung et al describes using LiF—Al double layers in order to improve electron injection of an organic electroluminescent (EL) device.

In an organic electroluminescent device, an anode is usually formed of indium tin oxide (ITO) on account of its transparency, high electrical conductivity and high work function. However, an organic electroluminescent device produced by forming a film of a hole-transporting compound directly on the surface of bare ITO generally has an insufficient current-voltage property and a lower operating stability. It is mainly attributed to a high injection barrier for the holes, dielectric breakdown by an electric field caused by projections on the surface of ITO. One way to avoid the problems is a method to introduce an intermediate layer between ITO and the hole-transporting compound. For example, Van Slyke et al illustrates that when copper phthalocyanine (CuPc) is pre-attached onto the surface of ITO, the organic device produced therefrom has improved stability (Organic electroluminescent devices with improved stability, S. A. Van Slyke, C. H. Chen and C. W. Tang, Applied Physics Letters, Vol. 69, 2160, 1996). However, when a CuPc layer is inserted between ITO and the hole-transporting compound, the hole injection barrier present on the interface between CuPc and the hole-transporting layer is still high, which leads to increasing the driving voltage. Starting from CuPc, extensive studies have been made on development of materials in order to alleviate the injection barrier for the holes. In any case, making use of the characteristics of low-molecular compounds, it has been attempted to improve the device performance by layer-by-layer deposition of a most suitable compound on the surface of an anode using vacuum deposition.

As mentioned above, though vacuum deposition is a method widely used for forming a film of a low-molecular light-emitting material, it is disadvantageous in that a vacuum apparatus is required. Moreover, the larger the area of the organic thin film to be formed is, the more difficult it is to form the organic thin film with a uniform thickness and to form a high-definition patterning. Thus, the method is not necessarily suitable for mass production of large area panels. Also, the method is accompanied by difficulty in forming a multilayer structure with an appropriate film thickness.

As a method to solve the problems, a spin coating method, ink-jet method and printing method, which are considered to be suitable for area enlargement and mass-production of organic light-emitting devices, have been developed as a film-forming method. In these methods, coating of a light-emitting layer is completed when a light-emitting polymer material dissolved in an organic solvent is coated to form a film on an anode. Vapor deposition is performed only when forming a cathode. Even in the case of an organic light-emitting device using a light-emitting polymer material, improvement of materials is indispensable for attaining high performance devices just as in the case of a device using a low-molecular light-emitting material. And an approach to the improvement differs from that in the case of a device having a multilayer structure of low-molecular materials.

In a typical structure of the organic light-emitting device of the present invention, an anode (transparent), an intermediate layer, a light-emitting layer and a cathode are formed in this order on a transparent substrate. Here, the intermediate layer may be called an anode buffer layer and is inserted for the purposes of preventing an electric short-circuit by smoothing the surface of the anode and alleviating the barrier against the hole injection from the light-emitting layer to the anode. A role required to the anode buffer layer is almost the same as that of CuPc proposed in producing a low-molecular organic light-emitting device. A polymer organic light-emitting device is produced by coating a polymer dissolved in an organic solvent, while a low-molecular organic light-emitting device is produced by depositing an upper layer onto a lower layer subsequently by a dry process. Accordingly, the properties required for the intermediate layer in a polymer organic light-emitting device differ slightly from those in the case of a low-molecular organic light-emitting device. That is, the following two points are critical during the step of coating an upper layer onto the intermediate layer: components of the intermediate layer material must not be dissolved in a solvent used for coating the upper layer on the intermediate layer, and if the components may not be dissolved in a solvent, they should not be peeled off or diffused by a physical impact at the time of coating. Furthermore, when the drying step is completed after coating, the interface between the upper and intermediate layers should have sufficient adherence. On that condition, the intermediate layer is required to have electric properties (capable of smoothing the anode surface, alleviating the barrier for hole injection, etc.) as revealed with a low-molecular organic electroluminescent device, and physical and chemical properties (should not undergo changes such as crystallization and dispersion into multiple layers accompanied by energization and time passage).

An aqueous solution of a mixture of polyethylene dioxythiophene (PEDOT) and polystyrene sulfonate (PSS) is generally used for the intermediate layer. With respect to this intermediate layer, a problem has been pointed out that polystyrene sulfonate contained as an external dopant infiltrates the upper light-emitting layer and thereby deteriorates it.

With respect to such a problem caused by mobile counter ions contained in the anode buffer layer, though Published Japanese Translation of PCT international publication No. 2003-509816 (WO2001/018888) discloses a method of using an anode buffer layer of self-doping polyaniline, it has not yet succeeded in exhibiting sufficient properties of the layer.

As technologies relating to the present invention, Japanese Laid-Open Patent Publication No. 2000-311869 discloses a surface modifying method of an organic electroluminescent device by radio frequency (RF) plasma treatment. However, the plasma application differs from that in the present invention in which a new layer is formed on the surface of an anode. Japanese Laid-Open Patent Publication No. 2000-150171 (EP 1026757 A2) discloses an organic electroluminescent device wherein a polymer thin film having a thickness of 0.2 to 3 nm, preferably 0.4 to 1 nm, is formed on the anode by radio frequency plasma polymerization, and a light-emitting multilayer structure is provided thereon. However, the publication does not describe a single light-emitting layer containing a polymer as a light-emitting material.

DISCLOSURE OF THE INVENTION

An object of the present invention is to provide an organic electroluminescent device with long life and high maximum luminance in order to solve the above-mentioned problems of the prior art. Furthermore, another object of the present invention is, with respect to the problem of the intermediate layer contained in an organic electroluminescent device, to provide an organic electroluminescent device provided with modification to avoid the problems of a conventional intermediate layer, specifically, to provide an organic electroluminescent device comprising an anode containing a smooth intermediate layer having a thickness of 0.2 to 30 nm.

As a result of extensive studies to solve the above problems of the prior art, the present inventors have found that an organic electroluminescent device comprising an anode containing on its surface a smooth intermediate layer having a thickness of 0.2 to 30 nm exhibits improved emission efficiency and operational stability, and have achieved the present invention.

That is, the present invention (I) relates to an organic electroluminescent device comprising a light-emitting compound layer present between an anode and a cathode, wherein the anode contains on its surface a smooth intermediate layer having a thickness of 0.2 to 30 nm.

The present invention (II) relates to the organic electroluminescent device of the invention (I), wherein the light-emitting compound is a phosphorescent polymer material.

The present invention (III) relates to the organic electroluminescent device of the invention (I), wherein the light-emitting compound is a fluorescent material.

Specifically, the present invention relates to an organic electroluminescent device; a producing method thereof; and a flat display light source, backlighting for a display unit and the like, display unit, lighting equipment and exterior and interior décor using the same as described below.

1. An organic electroluminescent device comprising a light-emitting compound layer present between an anode and a cathode, wherein the anode contains on its surface an intermediate layer having a thickness of 0.2 to 30 nm.
2. The organic electroluminescent device as described in 1 above, wherein the light-emitting compound is a phosphorescent polymer material.
3. The organic electroluminescent device as described in 1 above, wherein the light-emitting compound is a fluorescent material.
4. The organic electroluminescent device as described in 1 above, wherein the intermediate layer has an asperity of 1 nm or less expressed as an Ra value.

5. The organic electroluminescent device as described in 1 above, wherein the protrusion on the surface of the intermediate layer has a height of 10 nm or lower.
6. A production method of the organic electroluminescent device as described in any one of 1 to 5 above comprising an intermediate layer having a thickness of 0.2 to 30 nm on the surface of the anode, wherein an intermediate layer is formed as an organic thin film by radio frequency (RF) plasma treatment of a gasified organic compound.
7. A production method of the organic electroluminescent device as described in any one of 1 to 5 above comprising an intermediate layer having a thickness of 0.2 to 30 nm on the surface of the anode, wherein a thin film is formed on the anode after radio frequency plasma treatment of the anode (surface) and subjected to a subsequent optimization treatment to form an intermediate layer.
8. A production method of the organic electroluminescent device as described in any one of 1 to 5 above comprising an intermediate layer having a thickness of 0.2 to 30 nm on the surface of the anode, wherein, after radio frequency plasma treatment of the anode (surface), a thin film is formed on the anode by radio frequency (RF) plasma treatment of a gasified compound and subjected to a subsequent optimization treatment to form an intermediate layer.
9. The production method of the organic electroluminescent device as described in 7 or 8 above, wherein the optimization treatment is a washing treatment using a solvent.
10. The production method of the organic electroluminescent device as described in 6 or 8 above, which uses a compound containing fluorocarbon as a gasified compound to form a thin film.
11. The production method of the organic electroluminescent device as described in 7 or 8 above, wherein the radio frequency plasma treatment is performed in a gas containing one or more members selected from oxygen, argon and fluorocarbon in order to adjust the asperity of and the height of the protrusions on the surface of an anode.
12. An organic electroluminescent device obtained by the production method as described in any one of 6 to 11 above.
13. A flat display light using the organic electroluminescent device as described in any one of 1 to 5 or 12 above.
14. A backlighting for a display unit, display unit, lighting equipment or exterior and interior décor using the flat display light as described in 13 above.

BEST MODE FOR CARRYING OUT THE INVENTION

The present invention is described in more details hereinafter.

The present invention (I) is to improve the intermediate layer which was necessary in a conventional organic electroluminescent device but has not attained sufficient performance. In other words, the present invention provides an organic electroluminescent device containing a light-emitting compound layer present between an anode and a cathode, which can avoid the problems of a conventional intermediate layer (i.e., factors causing deterioration such as infiltration of molecules derived from the intermediate layer into a light-emitting layer), as well as maintain the roles of the intermediate layer provided between an anode and a light-emitting layer, i.e., imparting surface smoothness to the anode and alleviating the injection barrier for holes.

The embodiments of the present invention will be described specifically referring to the attached drawings.

Figure 1:
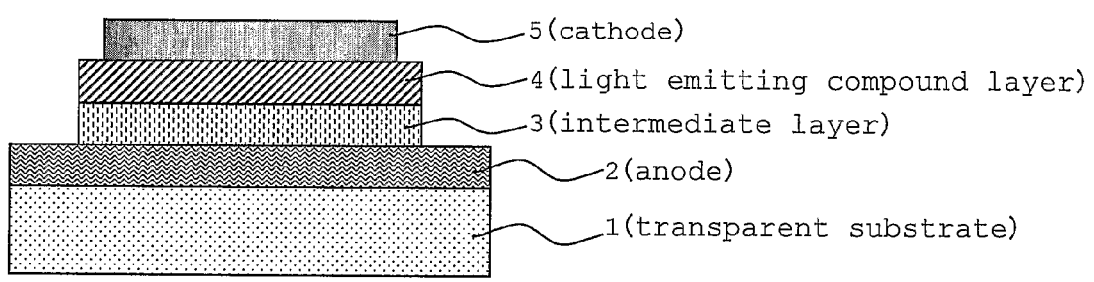
FIG. 1 is a diagrammatic illustration of an organic light emitting device laminated a layer containing light emitting compound on an anode.

FIG. 1 is a cross-sectional view showing an example of a structure of the organic electroluminescent device of the present invention, wherein an intermediate layer (3) and a light-emitting layer (4) are formed in this order between an anode (2) and a cathode (5) disposed on a transparent substrate (1).

An anode is formed of an electrically conductive and optically transparent layer represented by ITO. The optical transparency of the anode is essential to observe an organic luminescence through the substrate. Meanwhile, the optical transparency of the anode is not necessary in the case where an organic luminescence is observed by a top emission, in other words, through the upper electrode, and any appropriate materials such as a metal or metal compound having a work function of 4.1 eV or higher may be used for the anode. For example, gold, nickel, manganese, iridium, molybdenum, palladium or platinum may be used alone or in combination. The anode may be selected from a group consisting of an oxide, nitride, selenide or sulfide of a metal. A film formed of the above-mentioned metals may be used as an anode in the form of a thin film having a thickness of 1 to 3 nm which is provided on the surface of ITO without impairing the optical transparency of ITO. Methods of forming a film on the surface of the anode material include an electron beam deposition method, a sputtering method, a chemical reaction method, a coating method and vacuum deposition method. The thickness of the anode is preferably from 2 to 300 nm.

The structure of the organic electroluminescent device of the present invention is not limited to the example of FIG. 1. Other examples may include device structures wherein 1) intermediate layer/hole transporting layer/light-emitting layer, 2) intermediate layer/light-emitting layer/electron transporting layer, 3) intermediate layer/hole transporting layer/light-emitting layer/electron transporting layer, 4) intermediate layer/layer containing a hole transporting material, light-emitting material and electron transporting material, 5) intermediate layer/layer containing hole transporting material and light-emitting material, 6) intermediate layer/layer containing a light-emitting material and electron transporting material, 7) intermediate layer/layer containing a hole-electron transporting material and light-emitting material, or 8) intermediate layer/light-emitting layer/hole blocking layer/electron transporting layer, are subsequently provided between the anode and cathode. Or, though the light-emitting layer shown in FIG. 1 is a single layer, two or more light-emitting layers may be provided. In the present specification, a compound (layer) comprising all or one or more of an electron transporting material, hole transporting material and light-emitting material is referred to as a light-emitting compound (layer) unless otherwise noted.

The performance of the intermediate layer (adhesiveness to an anode substrate, finished surface smoothness, alleviation of the hole injection barrier, etc.) may be improved by pretreatment of the anode surface before forming a film of the intermediate layer. Pretreatment methods include, starting from a radio frequency plasma treatment, a sputtering treatment, corona treatment, UV ozone treatment and oxygen plasma treatment.

The first embodiment of the present invention is to provide an organic electroluminescent device comprising an anode containing on its surface an intermediate layer of an organic compound having a thickness of 0.2 to 30 nm, preferably 0.2 to 10 nm.

The composition or chemical structure of an organic matter forming the intermediate layer is not particularly limited. However, the following characteristics are prime requirement for the organic matter after the intermediate layer is formed, i.e., the components must not be redissolved by coating a light-emitting compound to be laminated as an upper layer of the intermediate layer, should not be peeled off or diffused by a physical impact during the coating step, and has a high adhesiveness with the light-emitting compound. No limitation is imposed on a kind of the compound for the intermediate layer as long as it possesses characteristics and a film thickness to satisfy the above requirements. As an example of a compound having a good adhesiveness, a compound preferably contains a partial structure having strong interaction with a light-emitting compound. It is particularly preferable that aromatic ring, alkyl chain, fluorine and the like which can expect hydrophobic interaction are contained in an appropriate amount in the compound as such a partial structure. The compound is not necessarily an organic material, but may be an inorganic material such as a metal fluoride, metal oxide or a compound containing silicon such as $SiO_2$.

The methods for forming the film of the intermediate layer are broadly divided into wet processing methods wherein the components are dissolved in a solvent for being coated and dry processing methods such as radio frequency plasma treatment, vacuum deposition and laser-induced thermal imaging. In either type, various film forming methods in general use can be applied.

In the case that the intermediate layer is formed by a wet processing coating, optimization treatment is performed after forming a film by a spin coating method, a casting method, a micro gravure coating method, a gravure coating method, a bar coating method, a roller coating method, a wire-bar coating method, a dip coating method, a spray coating method, a screen printing method, a flexo printing method, an offset printing method and an ink-jet printing method. That is, the intermediate layer can be obtained by washing (cleaning) the surface of the film with a solvent capable of dissolving the component of light-emitting compounds in order to improve or modify the film characteristics. In the washing step with a solvent, a method such as a spin coating method, an ink-jet method and a dip method can be used similarly as in the coating step of the intermediate layer. In other words, the components which may disperse or diffuse newly generated during the step of laminating a light-emitting compound as an upper layer can be removed by washing the surface with a solvent. Furthermore, after the intermediate layer completely covers the asperity and protrusions on the substrate surface, adjusting the number of washing the surface of the intermediate layer with a solvent enables not only to remove the excess liberated component attached on the surface but also to give an intermediate layer retaining the surface smoothness. Also, the surface treatment with a solvent enables to adjust the surface energy. On the basis of the status immediately after the film is formed, a water contact angle changes from 5 to 140° by newly subjected to a washing treatment, which enables to adjust the surface energy depending on polar character of the light-emitting compound to be laminated.

Besides, the similar effects can be obtained by radiation treatment such as ion implantation, UV radiation and UV ozone radiation or an additional oxygen, nitrogen or hydrogen plasma treatment.

A compound to be used for the above-mentioned wet processing film forming is not particularly limited so long as the compound has good adhesiveness to the anode surface and the light emitting compound. However, it is preferable to adopt one generally used for an anode buffer. Examples of the compound include an electrically conductive polymer such as PEDOT (a mixture of poly(3,4)-ethylenedioxythiophene and polystyrenesulfonic acid) and PANI (a mixture of polyaniline and polystyrenesulfonic acid). Further, an organic solvent such as toluene and isopropyl alcohol may be added to the electrically conductive polymers. The electrically conductive polymer may contain a third component such as a surfactant. An example of the above-mentioned surfactant is a surfactant containing a group selected from a group of an alkyl group, alkyl aryl group, fluoro alkyl group, alkyl siloxane group, sulphate, sulfonate, carboxylate, amide, a betaine structure and quaternary ammonium group. A nonionic fluoride surfactant may also be used.

A film of the intermediate layer can be formed by a dry processing method such as vacuum deposition and radio frequency plasma treatment. Particularly, a radio frequency plasma treatment, wherein glow discharge is applied to an organic gas to thereby deposit the gas as a solid on a solid layer, enables to obtain a film excellent in adhesiveness and durability. For example, by bringing gasified fluorocarbon contact with a substrate by glow discharge in RF plasma, a thin film comprising fluorocarbon can be formed on the substrate. A thin fluorocarbon film can be formed by plasma treatment of gasified fluorocarbon in anRF device, and the gasified fluorocarbon can be selected from a group consisting of $C_3F_8$, $C_4F_{10}$, $CHF_3$, $C_2F_4$ and $C_4F_8$. Plasma is generated by applying (outputting) a radio frequency (RF) voltage in a device at an appropriate power level. Though a reaction temperature may vary depending on the parameters such as power output, gas flow rate and treatment time period, it is preferable to provide a temperature regulator in a device so as to attain reproducibility of the thickness of the film.

When forming the intermediate layer using a dry processing method by radio frequency plasma treatment, the surface of the anode can be etched by controlling the conditions for plasma generation. That is, by radio frequency plasma treatment, the anode surface can be smoothed using the effect of the anode surface etching at the same time with the film formation.

The obtained thin film can be optimized similarly as the intermediate layer obtained by the above-mentioned coating method. That is, the characteristics of the film can be improved or modified by a further surface treatment. Specifically, smoothness, an appropriate thickness and durability of the film can be adjusted to fall within an appropriate range by washing with a solvent. Here, smoothness of the film means the state that the asperity (Ra value) is 1 nm or less and the height of the protrusions is 10 nm or less on the surface of the film, and an appropriate thickness of the film is 0.2 to 30 nm. Similarly, the surface energy of the film can also be adjusted. Further, the similar effects can be obtained by annealing treatment under various atmosphere; radiation treatment such as ion implantation, UV radiation and UV ozone radiation; or an additional oxygen, nitrogen or hydrogen plasma treatment of the film.

As a compound to be used for the organic light-emitting compound layer in the organic electroluminescent device of the present invention, that is, for the light-emitting layer, hole transporting layer and electron transporting layer, not only a low-molecular compound but also a polymer may be employed.

Examples of the light-emitting material forming the organic light-emitting compound layer in the organic electroluminescent device of the present invention include low-molecular compound and polymer light-emitting materials described in Ohyoh Butsuri (Applied Physics), Yutaka Ohmori, Vol. 70, No. 12, pages 1419-1425 (2001). Among these, polymer light-emitting materials are preferable in view of simplifying the production process of devices, and phosphorescent light-emitting materials are more preferable owing to high emission efficiency. Accordingly, a phosphorescent light-emitting polymer is specifically preferable.

No particular limitation is imposed on the structure of the phosphorescent light-emitting polymer to be used in the light-emitting layer in the organic electroluminescent device of the present invention. Specific examples of the polymer structure include a polymer structure wherein a phosphorescent light-emitting site (typical examples include a monovalent or bivalent group of a transition metal complex or a rare-earth metal complex as described later) is combined with a skeleton structure of a conjugated polymer such as poly(p-phenylene), poly (p-phenylenevinylene), polyfluorene, polythiophene, polyaniline, polypyrrole and polypyridine. In such a polymer structure, the phosphorescent light-emitting site may be combined into a main chain or a side chain.

Another example of the polymer structure of the phosphorescent light-emitting polymer compounds includes a polymer structure wherein a phosphorescent light-emitting site is combined with a skeleton structure of a nonconjugated polymer such as polyvinyl carbazole, polysilane, polytriphenyl amine. In such a polymer structure, the phosphorescent light-emitting site may be combined into a main chain or a side chain.

Still another example of the polymer structure of the phosphorescent light-emitting polymer compounds includes a dendrimer containing a phosphorescent light-emitting site. In this case, the phosphorescent light-emitting site may be combined in either of the core, branching part or end of the dendrimer.

While the phosphorescent light-emitting site combined to the conjugated or nonconjugated skeleton structure emits phosphorescent light in the above-mentioned polymer structures, the skeleton structure itself may emit phosphorescence.

As a phosphorescent light-emitting polymer to be used in the organic electroluminescent device of the present invention, a polymer wherein a phosphorescent light-emitting site is combined with a skeleton structure of a nonconjugated polymer (to be called "a nonconjugated phosphorescent light-emitting polymer" hereinafter) is preferable because it gives much flexibility in material design, can easily attain phosphorescent emission, can be easily synthesized, and enables to easily prepare a coating solution owing to high solubitily in a solvent.

Figure 2:
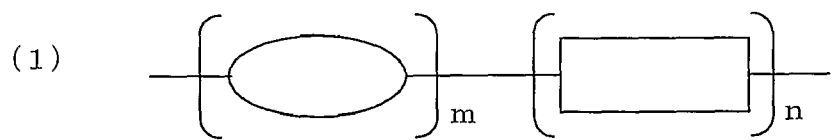
FIG. 2 is a constitutional example of a phosphorescent moiety and a carrier transporting moiety in a nonconjugated phosphorescent polymer.
Figure 2:
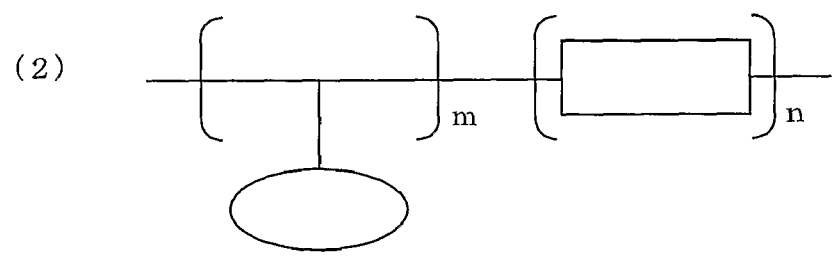
Figure 2:
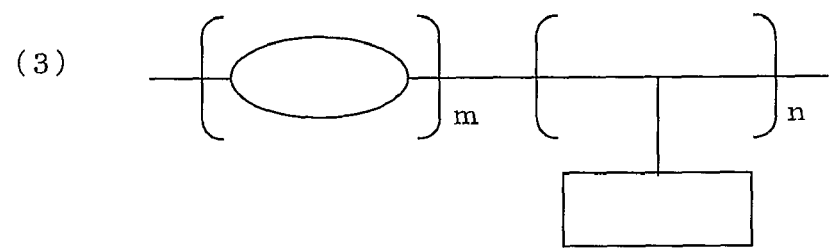
Figure 2:
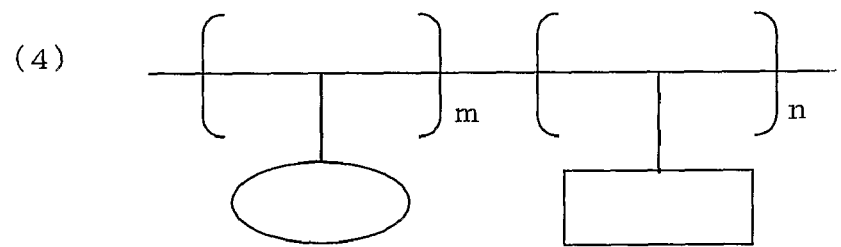
Figure 2:
Figure 2:
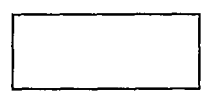
Figure 3:
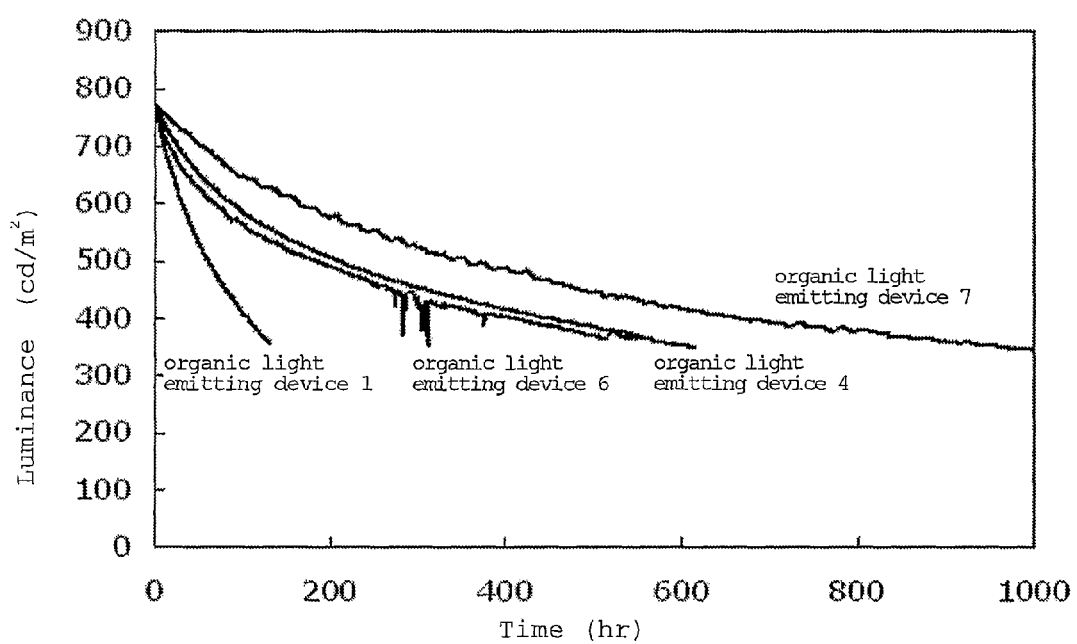
FIG. 3 is a graph illustrated the results of the durability test of the organic light emitting device 1 (Comparative Example 1), organic light emitting device 4 (Example 2), organic light emitting device 6 (Example 3) and organic light emitting device 7 (Example 4).

A nonconjugated phosphorescent light-emitting polymer is constructed of a phosphorescent light-emitting site and a carrier transporting site. Typical polymer structures may be divided as follows depending on the conditions of combination of the phosphorescent light-emitting site and carrier transporting site:

(1) both of the phosphorescent light-emitting site and carrier transporting site are present in the main chain of the polymer (FIG. 2(1)),
(2) the phosphorescent light-emitting site is present in the side chain while the carrier transporting site is in the main chain of the polymer (FIG. 2(2)),
(3) the phosphorescent light-emitting site is present in the main chain while the carrier transporting site is in the side chain of the polymer (FIG. 2(3)), and
(4) both of the phosphorescent light-emitting site and carrier transporting site are present in the side chain of the polymer (FIG. 2(4)).

The above-mentioned nonconjugated phosphorescent light-emitting polymer may contain a cross-linking structure; may be a homopolymer wherein a hole transporting material, electron transporting material or light-emitting material is not linked with and independent from each other; or may be a polymer polymerized of two materials. Further, among the polymer materials, at least one of the three materials selected from the hole transporting material, electron transporting material and light-emitting material should be a polymer, and the other two materials may be low-molecular weight compounds.

The above-mentioned nonconjugated phosphorescent light-emitting polymer may contain two or more of phosphorescent light-emitting sites (any of the sites may be present in either of the main or side chain of the polymer), and may contain two or more of carrier transporting sites (any of the sites may be present in either of the main or side chain of the polymer, or may not be combined with each other).

The molecular weight of the above-mentioned nonconjugated phosphorescent light-emitting polymer is preferably 1,000 to 100,000 by weight-average molecular weight, and more preferably, 5,000 to 50,000.

For the above-mentioned phosphorescent light-emitting site, a monovalent group, or polyvalent (divalent or more) group of a compound which emits phosphorescence at room temperature may be used, and a monovalent or divalent group of transition metal or rare-earth metal complex is preferable. Examples of transition metal used for the transition metal complex above include metals from Sc (atomic number 21) to Zn (atomic number 30) in the first transition element series, Y (atomic number 39) to Cd (atomic number 48) in the second transition element series, and Hf (atomic number 72) to Hg (atomic number 80) in the third transition element series. Examples of rare-earth metal used for the rare-earth metal complex above include metals from La (atomic number 57) to Lu (atomic number 71) in the lanthanoid series of the periodic table.

Examples of the ligand used in the transition metal or rare-earth metal complex include those described in G. Wilkinson (Ed.), Comprehensive Coordination Chemistry (Plenum Press, 1987) and in Akio Yamamoto, "Yuuki Kinzoku Kagaku —Kiso to Ohyoh—" (Metalorganic Chemistry —basic and applied—), Shokabo, 1982. Among those, preferable are halogen ligand, nitrogen-containing heterocycle ligand (phenylpyridine ligand, benzoquinoline ligand, quinolinol ligand, bipyridyl ligand, terpyridyl ligand, phenanthroline ligand, etc.), diketone ligand (acetylacetone ligand, dipivaloyl methane ligand, etc.) carboxylate ligand (such as acetate ligand), phosphorus ligand (triphenylphosphine ligand, phosphite ester ligand, etc.), carbon monoxide ligand, isonitrile ligand and cyano ligand. The metal complex may contain one or more kinds of such ligands in one complex. Also, as the metal complex, binuclear complex, multinuclear complex, or composite consisting of two or more of these complexes may be used.

A monovalent or polyvalent (divalent or more) group which may have hole-transporting or electron-transporting property, or bipolar property transporting both of holes and electrons may be used for the above-mentioned carrier transporting site. For the hole-transporting site, a monovalent or polyvalent (divalent or more) group of carbazole, triphenylamine, N,N'-diphenyl-N,N'-(3-methylphenyl)-1,1'-biphenyl-4,4'diamine (TPD) may be used. For the electron-transporting carrier site, quinolinol derivative metal complex such as aluminum tris(quinolinolate) (Alq$_3$); a monovalent or polyvalent (divalent or more) group of oxadiazole derivative, triazole derivative, imidazole derivative and triazine derivative; and a boron compound may be used. For the bipolar carrier site, monovalent or polyvalent (divalent or more) group of 4,4'-N,N'-dicarbazole-biphenyl (CBP) may be used.

The light-emitting layer in the organic electroluminescent device of the present invention can be formed only from the above-mentioned phosphorescent polymer compound or conjugated polymer. Moreover, for the purpose of complementing the carrier transporting property of the polymer compound or conjugated polymer, the light-emitting layer may also be formed as a composition wherein other carrier transporting compound(s) is mixed. That is, when the phosphorescent polymer compound is a hole-transporting material, an electron-transporting compound may be mixed therewith, and when the phosphorescent polymer compound is an electron-transporting material, a hole-transporting compound may be mixed. Here, the carrier transporting compound to be mixed with the phosphorescent polymer compound may be either of a low-molecular weight compound or a polymer.

Examples of a hole-transporting low-molecular weight compound which can be mixed with the above-mentioned phosphorescent polymer include known hole-transporting materials, for example, triphenylamine derivatives such as N,N'-diphenyl-N,N'-(3-methylphenyl)-1,1'-biphenyl-4,4'diamine (TPD), 4,4'-bis[N-(1-naphtyl)-N-phenylamino]biphenyl (α-NPD) and 4,4',4"-tris(3-methylphenylphenylamino)triphenylamine (m-MTDATA). Examples of a hole-transporting polymer which can be mixed with the above-mentioned phosphorescent polymer include a compound macromolecularized by introducing a polymerizable functional group into a triphenylamine low-molecular weight compound, for example, a polymer having a triphenylamine skeleton structure disclosed in Japanese Laid-Open Patent Publication No. H8-157575.

Examples of the electron-transporting low-molecular weight compounds which can be mixed with the above-mentioned phosphorescent polymer include quinolinol derivative such as aluminum tris(quinolinolate) (Alq$_3$), oxadiazole derivative, triazole derivative, imidazole derivative and triazine derivative. Examples of an electron-transporting polymer which can be mixed with the above-mentioned phosphorescent polymer include a compound macromolecularized by introducing a polymerizable functional group into the above-mentioned electron-transporting low-molecular weight compound, for example, poly PBD disclosed in Japanese Laid-Open Patent Publication No. H10-1665.

Moreover, for the purpose of improving properties of a film formed from the above-mentioned phosphorescent polymer, other polymer compounds, which do not directly participate in light-emitting property of the phosphorescent polymer, may be mixed to thereby form a composition to be used as light emitting material. For example, polymethylmethacrylate (PMMA) and polycarbonate may be added for the purpose of imparting flexibility to the obtained film.

The thickness of the light-emitting layer is preferably 1 nm to 1 μm, more preferably 5 to 300 nm, still more preferably 10 to 100 nm.

Examples of a hole-transporting material which forms the hole-transporting layer in the organic phosphorescent light-emmitting device of the present invention include known low-molecular weight hole-transporting materials, for example, triphenylamine derivatives such as N,N'-diphenyl-N,N'-(3-methylphenyl)-1,1'-biphenyl-4,4'diamine (TPD), 4,4'-bis[N-(1-naphtyl)-N-phenylamino]biphenyl (α-NPD) and 4,4',4"-tris(3-methylphenylphenylamino)triphenylamine (m-MTDATA). A polymer hole-transporting material may also be used, and the examples include a compound macromolecularized by introducing a polymerizable functional group into a triphenylamine low-molecular weight compound, for example, the polymer having a triphenylamine skeleton structure disclosed in Japanese Laid-Open Patent Publication No. H8-157575 and polymer materials such as poly(paraphenylenevinylene) and polydialkylfluorene. These hole transporting materials may be used singly or two or more of them may be used in combination or in laminates. The thickness of the hole transporting layer is preferably 1 nm to 5 μm, more preferably 5 nm to 1 μm, further preferably 10 to 500 nm.

In the organic electroluminescent device of the present invention, examples of the electron transporting materials used for forming the electron transporting layer or for mixing into the light-emitting layer include low-molecular electron transporting materials such as quinolinol derivative metal complexes like aluminum tris(quinolinolate) (Alq$_3$), oxadiazole derivative, triazole derivative, imidazole derivative and triazine derivative. Further, the electron transporting material may be a polymer produced by introducing a polymerizable functional group into the above-mentioned low molecular electron transporting compound, such as poly(PBD) disclosed in Japanese Laid-Open Patent Publication No. H10-1665. These electron transporting materials may be used singly, or mixed or layered with other electron transporting materials. The thickness of the electron transporting layer is preferably 1 nm to 5 μm, more preferably 5 nm to 1 μm, further preferably 10 to 500 nm.

Each of the phosphorescent light-emitting polymer, the hole transporting material for the hole transporting layer and the electron transporting material for the electron transporting layer may be formed into each layer individually, or by using a polymer material as a binder. Examples of the polymer materials usable for the binder include polymethyl methacrylate, polycarbonate, polyester, polysulfone and polyphenylene oxide. The method for forming the light-emitting layer, the hole transporting layer and the electron transporting layer may be a resistance heating deposition method, an electron beam deposition method, a sputtering method, a spin coating method, a casting method, a micro gravure coating method, a gravure coating method, a bar coating method, a roller coating method, a wire-bar coating method, a dip coating method, a spray coating method, a screen printing method, a flexo printing method, an offset printing method and an ink-jet printing method, etc. In case of using low molecular weight compounds, dominantly employed are resistance heating deposition method and the electron beam deposition method, and in case of using polymer materials, dominantly employed are a spin coating method, a casting method, a micro gravure coating method, a gravure coating method, a bar coating method, a roller coating method, a wire-bar coating method, a dip coating method, a spray coating method, a screen printing method, a flexo printing method, an offset printing method and an ink-jet printing method.

For the purpose of efficiently recombining holes with electrons in the light-emitting layer, a hole blocking layer may be disposed on the cathode side of the light-emitting layer in order that holes can be prevented from passing through the light-emitting layer. A compound having a lower HOMO (Highest Occupied Molecular Orbital) than the light emitting material can be used for the hole blocking layer. Examples of the compounds include triazole derivative, oxadiazole derivative, phenanthroline derivative and aluminum complex.

Furthermore, in order to prevent deactivation of excitons at a cathode metal, an exciton blocking layer may be provided adjacent to the cathode side of the light-emitting layer. For the exciton blocking layer, a compound having greater triplet excitation energy than the light emitting material can be used, for example, triazole derivative, phenanthroline derivative and aluminum complex.

For a cathode in the organic electroluminescent device of the present invention, a compound which has chemical stability and low work function is used. Examples include known cathode materials such as Al, MgAg alloy and alloy of Al and alkali metals such as AlLi and AlCa. From the viewpoint of chemical stability, work function of the compound is preferably 2.9 eV or more. A film of the cathode material can be formed by a method such as a resistance heating deposition method, electron beam deposition method, sputtering method and ion plating method. The thickness of the cathode is preferably 10 nm to 1 µm, more preferably 50 to 500 nm.

For the purpose of lowering the electron-injection barrier from the cathode into the organic layer and enhancing efficiency in injecting electrons, a cathode buffer layer (a metal layer having a lower work function than the cathode) may be inserted between the cathode and the organic layer adjacent to the cathode. Low work-function metals to be used for such a purpose include alkali metals (Na, K, Rb and Cs), alkali earth metals (Sr and Ba) and rare-earth metals (Pr, Sm, Eu and Yb). The thickness of the cathode buffer layer is preferably 0.05 to 50 nm, more preferably 0.1 to 20 nm, still more preferably 0.5 to 10 nm.

The cathode buffer layer may also be formed as a mixture of the above-mentioned substance having low work function and electron-transporting materials. For an electron-transporting material to be used in the cathode buffer layer, the above-mentioned organic compounds for an electron transporting layer may be used. Codeposition may be used as a method of forming a film for the cathode buffer layer. Also, in case where a film can be formed by applying a solution, already described methods for forming a film may be used, e.g., a spin coating method, a dip coating method, an ink jet method, a printing method, a spray method and a dispenser method. In this case, the thickness of the cathode buffer layer is preferably to 0.1 to 100 nm, more preferably 0.5 to 50 nm, still more preferably 1 to 20 nm.

In the organic electroluminescent device of the present invention, the substrate may be an insulating substrate transparent for the emission wavelength of the light emitting material. Known materials, for example, glasses and transparent plastics including PET (polyethylene terephthalate) and polycarbonate can be used for the substrate.

EXAMPLES

The present invention will be explained in more detail below with reference to examples and comparative examples, but the present invention is not restricted thereto.

For simplification, materials and layers formed by the same were abbreviated as follows.

ITO: indium tin oxide (anode),

PEDOT-PSS: mixture of poly(3,4-ethylenedioxythiophene) and polystyrene sulfonate (anode buffer layer=conventional intermediate layer)

ELP: phosphorescent polymer (ternary copolymer including molecular structures of aromatic amine (hole transporting material moiety), boron-based molecule (electron transporting material moiety) and iridium complex (phosphorescent pigment moiety) poly[viTPD-viTMB-viIr(ppy)$_2$(acac)]).

As a plasma generator, an apparatus of capacity coupling type, capable of plasma etching (PE) and reactive ion etching (RIE), was used.

Comparative Example 1

An organic light emitting device was produced using an ITO (indium tin oxide)-coated substrate which was a 25-mm-square glass substrate with two 4-mm-width ITO electrodes formed in stripes as an anode on one surface of the substrate. First, the anode substrate was cleaned with liquid. That is, the anode substrate was subjected to ultrasonic cleaning with commercially produced cleaner and then washed with running ultrapure water. After that, the anode substrate was subjected to ultrasonic cleaning soaking in isopropyl alcohol (IPA) and dried. In addition, a solution of poly(3,4-ethylenedioxythiophene)-polystyrene sulfonate (BAYTRON P (trade name) manufactured by Bayer Co.) diluted with IPA by a ratio of 1:1 was applied onto the ITO (anode) by a spin coating method under conditions of a rotation rate of 3,500 rpm and a coating time of 40 seconds, and dried at 200° C. for 30 minutes to form a conventional intermediate layer. The obtained intermediate layer had a film thickness of approximately 50 nm, Ra value of 1.3 nm and a height of projection of 20 nm.

Then, a coating solution for forming a luminescent compound was prepared. That is, 60 mg of ELP was dissolved in 1,940 mg of toluene (special grade, manufactured by Wako Pure Chemical Industries, Ltd.), and the obtained solution was passed through a filter with a pore size of 0.2 µm to obtain a coating solution. Next, the prepared coating solution was applied onto the intermediate layer by a spin coating method under conditions of a rotation rate of 3,000 rpm and a coating time of 30 seconds, and dried at 100° C. for 30 minutes, to form a light emitting layer. The obtained light emitting layer had a film thickness of approximately 90 nm. Then, the substrate with the light emitting layer formed thereon was placed in a deposition apparatus, calcium was deposited at a vapor deposition rate of 0.01 nm/s to be a thickness of 10 nm and aluminum was deposited subsequently at a vapor deposition rate of 1 nm/s to be a thickness of 150 nm, to prepare device 1. In addition, the calcium layer and the aluminum layer were formed in the form of two stripes of 3 mm in width in a direction perpendicular to the longitudinal direction of the anodes to fabricate four organic light emitting devices of 4 mm (length)×3 mm (width) per one glass substrate. The device was assumed as organic light emitting device 1.

REFERENCE EXAMPLE

A substrate with ITO dried after liquid cleaning in a same manner as in Comparative Example 1 was placed into a plasma generator, and oxygen gas was supplied into the apparatus. By applying an alternating voltage into the apparatus, discharge was initiated and then oxygen plasma was generated to expose the substrate with ITO. The gas flow rate supplying into the apparatus was controlled to be a pressure of 1 Pa during formation of oxygen plasma. The electric power supplied to the substrate of the device was 150 W and the processing time was 30 seconds. The subsequent procedures was carried out in the same manner as in Comparative Example 1 to prepare organic light emitting device 2 having a conventional intermediate layer. The obtained intermediate layer by the operation had Ra value of 0.7 nm and a height of projection of 9 nm.

Example 1

A substrate with ITO was subjected to liquid cleaning followed by a oxygen plasma cleaning processing in the same manner as in Reference Example to prepare a substrate coated with a conventional intermediate layer. The thickness of the obtained a conventional intermediate layer and the surface roughness of the obtained substrate coated with a conventional intermediate layer was measured and as a result of this, the film thickness was 50 nm, the Ra value was 0.7 nm and the height of projection was 9 nm. Next, the substrate coated with a conventional intermediate layer was optimized. That is, the substrate coated with a conventional intermediate layer was fixed on a spin coater and IPA was dropped thereon while spinning it at 3000 rpm to clean the substrate. The cleaning was carried out for 1 minutes. After dropping, the substrate was further spun at 4000 rpm for 1 minutes and then dried at 200° C. for 1 minutes. The obtained intermediate layer after optimization had a film thickness of 27 nm, Ra value of 0.5 nm and a height of projection of 7 nm. The subsequent procedures from ELP coating was carried out in the same manner as in Comparative Example 1 to prepare organic light emitting device 3.

Example 2

A substrate with ITO dried after liquid cleaning in a same manner as in Comparative Example 1 was placed into a plasma generator, and oxygen gas was supplied into the apparatus. By applying an alternating voltage into the apparatus, discharge was initiated and then oxygen plasma was generated to expose the substrate with ITO. That is, the oxygen gas flow rate supplying into the apparatus was controlled to be a pressure of 1 Pa. The plasma processing was carried out at 150 W of supplied electric power for 30 seconds. Next, the supplying gas was changed from oxygen gas to $CHF_3$ gas and the flow rate was controlled to be a pressure of 7 Pa. Then, the plasma processing of the substrate was carried out at 300 W of supplied electric power for 10 seconds in PE mode. As a result of an X-ray photoelectron spectroscopy (XPS) analysis of the surface of the substrate with ITO after the process, it was found that a fluorocarbon film (described as "CFn intermediate layer" in Table 1) was formed on the surface of the substrate with ITO. It was further found by the analysis to the depth direction that the fluorocarbon film had a thickness of approximately 1 nm, Ra value of 0.7 nm and a height of projection of 8 nm. After the formation of the intermediate layer by the present invention as above, the subsequent procedures from ELP coating was carried out in the same manner as in Comparative Example 1 to prepare organic light emitting device 4.

Comparative Example 2

A substrate with ITO dried after liquid cleaning in a same manner as in Comparative Example 1 was placed into a plasma generator, and oxygen gas was supplied into the apparatus. By applying an alternating voltage into the apparatus, discharge was initiated and then oxygen plasma was generated to expose the substrate with ITO. That is, the oxygen gas flow rate supplying into the apparatus was controlled to be a pressure of 1 Pa. The plasma processing was carried out 150 W of supplied electric power for 30 seconds. Next, the supplying gas was changed from oxygen to $CHF_3$ gas and the flow rate was controlled to be a pressure of 7 Pa. Then, the plasma processing of the substrate was carried out at 300 W of supplied electric power for 2 minutes in PE mode. As a result of an X-ray photoelectron spectroscopy (XPS) analysis of the surface of the substrate with ITO after the process, it was found that a fluorocarbon film was formed on the surface of the substrate with ITO. It was further found that the fluorocarbon film had a thickness of 27 nm, Ra value of 0.5 nm and a height of projection of 4 nm. After the formation of the intermediate layer consisting of fluorocarbon as above, the subsequent procedures from ELP coating was carried out in the same manner as in Comparative Example 1 to prepare organic light emitting device 5.

Example 3

A substrate with ITO dried after liquid cleaning in a same manner as in Comparative Example 1 was placed into a plasma generator, and oxygen gas was supplied into the apparatus. By applying an alternating voltage into the apparatus, discharge was initiated and then oxygen plasma was generated to expose the substrate with ITO. The oxygen gas flow rate supplying into the apparatus was controlled to be a pressure of 1 Pa. The plasma processing was carried out 150 W of supplied electric power for 30 seconds. Next, the supplying gas was changed from oxygen to $CHF_3$ gas and the flow rate was controlled to be a pressure of 7 Pa. Then, the plasma processing of the substrate was carried out at 100 W of applied electric power for 10 seconds in PE mode. As a result of an X-ray photoelectron spectroscopy (XPS) analysis of the surface of the substrate with ITO after the process, it was found that a fluorocarbon film was formed on the surface of the substrate with ITO. It was further found that the fluorocarbon film had a thickness of approximately 0.2 nm and Ra value of 0.7 nm. The substrate subjected to the plasma processing with oxygen gas and fluorine gas as above was coated a conventional intermediate layer in the same manner as in Reference Example to prepare a substrate with a conventional intermediate layer. The surface roughness of the obtained substrate by coated a conventional intermediate layer was measured and the substrate had a thickness of 50 nm and Ra value of 1.0 nm. Next, the substrate coated with the conventional intermediate layer was optimized. That is, the substrate coated with the conventional intermediate layer was fixed on a spin coater and IPA was dropped thereon while spinning it at 3000 rpm to clean the substrate. The cleaning was carried out for 1 minutes. After dropping, the substrate was further spun at 4000 rpm for 1 minutes and then dried at 200° C. for 1 minutes. The obtained intermediate layer after optimization had a thickness of 30 nm, Ra value of 0.5 nm and a height of projection of 8 nm. The subsequent procedures from ELP coating was carried out in the same manner as in Comparative Example 1 to prepare organic light emitting device 6.

Example 4

A substrate with ITO dried after liquid cleaning in a same manner as in Comparative Example 1 was placed into a plasma generator, and $CHF_3$ gas was supplied into the apparatus. The $CHF_3$ gas flow rate was controlled to be a pressure of 7 Pa. Then, the plasma processing for the substrate was carried out at 200 W of applied electric power for 60 seconds in RIE mode. As a result of a measurement for the surface roughness of the substrate with ITO after the plasma processing, the surface had Ra value of 0.8 nm. Moreover, as a result of an X-ray photoelectron spectroscopy (XPS) analysis for the surface of the substrate, it was found that a fluorocarbon film was formed on the surface of the substrate with ITO. It was estimated that the fluorocarbon film had a thickness of 0.5 nm and a height of projection of 3 nm. To the substrate after being subjected to the plasma processing of $CHF_3$ gas as above, the subsequent procedures from ELP coating was carried out in the same manner as in Comparative Example 1 to prepare organic light emitting device 7.

Voltage was applied between cathode and anode of the above-mentioned devices respectively by using a programmable direct voltage/current source TR6143 manufactured by Advantest Corporation to cause luminescence and the luminance was measured by using a luminance meter BM-8 manufactured by Topcon Corporation. Lower luminance was also observed to conduct a durability test. The result of the estimation of the EL luminescence property are shown in Table 1.

The durability mentioned herein is estimated in terms of brightness half-life assuming that the initial luminance is 100 $cd/m^2$.

organic light emitting devices by the present invention has improved dramatically compared with that of the organic light emitting device 1 having a conventional intermediate layer.

The present invention has described referring the embodiment specifically. However, it is possible to modify the examples within the scope and intent of the present invention.

INDUSTRIAL APPLICABILITY

The organic electroluminescent device comprising a light-emitting compound layer present between an anode and a cathode, wherein the anode contains on its surface an intermediate layer having a thickness of 0.2 to 30 nm according to the present invention (I) enables to obtain high emission efficiency and long device life.

TABLE 1

| Element No. | Composition of Element | Luminescence Starting Voltage [V] | Maximum Luminance (cd/m²) | External Quantum Efficiency (%) | Durability (hour) |
|---|---|---|---|---|---|
| 1 (Comp. Ex. 1) | ITO/Conventional Intermediate Layer/ELP/CaAl | 2.5 | 66,000 | 6.6 | 900 |
| 2 (Ref. Ex.) | (O₂) Plasma-processed ITO/Conventional Intermediate Layer/ELP/CaAl | 2.5 | 75000 | 6.1 | 1,000 |
| 3 (Ex. 1) | (O₂) Plasma-processed ITO/Conventional Intermediate Layer + Optimization/ELP/CaAl | 2.5 | 79,000 | 6.0 | 2,500 |
| 4 (Ex. 2) | (O₂) Plasma-processed ITO/CFn Intermediate Layer/ELP/CaAl | 2.4 | 74,000 | 7.5 | 4,300 |
| 5 (Comp. Ex. 2) | (O₂) Plasma-processed ITO/CFn Intermediate Layer/ELP/CaAl | — | No Luminance | — | — |
| 6 (Ex. 3) | (O₂ + CHF₃) Plasma-processed ITO/Conventional Intermediate Layer + Optimization/ELP/CaAl | 2.4 | 78,000 | 5.6 | 4,000 |
| 7 (Ex. 4) | (CHF₃) Plasma-processed ITO/ELP/CaAl | 2.4 | 82,000 | 7.3 | 7,500 |

In comparative example 2, an electric current did not passed at all and a luminescence was not observed even when the driving voltage was elevated up to 20 V. It is found that the $CF_n$ intermediate layer, which is a insulating film, having a thickness of over 30 nm, has no contribution for improvement of property of an device while the thickness of the layer in a thinner region is the most appropriate.

As shown in the result of the estimation for organic light emitting device 1 to 7, it is cleared that the durability of the devices has improved drastically by the present invention. Moreover, it is shown that the smoothness of the surface has been improved by the plasma processing of only $CHF_3$ gas and the property of an device has also been improved.

FIG. 2 shows the result of the durability test of luminance for organic light emitting device 1 (Comparative Example 1), organic light emitting device 4 (Example 2), organic light emitting device 6 (Example 3) and organic light emitting device 7 (Example 4). It is shown that the durability of the

The invention claimed is:

1. A production method of an organic electroluminescent device having a luminescent compound layer between an anode and a cathode, wherein the anode contains on its surface an intermediate layer having a thickness of 0.2 to 30 nm, and the method is characterized by a step of forming the intermediate layer by a wet coating method and then washing the surface of the intermediate layer with a solvent capable of dissolving a component of a light-emitting compound.

2. A method as claimed in claim 1, wherein the light-emitting compound is a phosphorescent polymer material.

3. A method as claimed in claim 1, wherein the light-emitting compound is a fluorescent material.

4. A method as claimed in claim 1, wherein the intermediate layer has an asperity of 1 nm or less expressed as an Ra value.

5. A method as claimed in claim 1, wherein a protrusion on the surface of the intermediate layer has a height of 10 nm or lower.

6. A method as claimed in claim 1, which comprises treating the anode surface with a radio frequency plasma before forming the intermediate layer.

7. A method as claimed in claim 6, wherein the radio frequency plasma treatment is performed in a gas containing one or more members selected from the group consisting of oxygen, argon and fluorocarbon for adjusting an asperity and height of protrusions on the anode surface.

8. A method as claimed in claim 1, wherein the intermediate layer comprises an organic material.

9. A method as claimed in claim 1, wherein the intermediate layer contains an electrically conductive polymer.

10. A method as claimed in claim 1, wherein the solvent capable of dissolving the component of a light-emitting compound is isopropyl alcohol.

11. A backlighting for a display unit comprising the organic electroluminescent device obtained by the production method as claimed in claim 1, as a flat display light.

12. A lighting equipment comprising the organic electroluminescent device obtained by the production method as claimed in claim 1, as a flat display light.

13. A method as claimed in claim 1, wherein said step of forming the intermediate layer by a wet coating method comprises applying a coating composition comprising components of the intermediate layer dissolved in a coating solvent.

* * * * *